(12) United States Patent
Tajmar

(10) Patent No.: US 11,705,299 B2
(45) Date of Patent: Jul. 18, 2023

(54) METHOD AND DEVICE FOR OPERATING A LIQUID METAL-ION SOURCE OR LIQUID METAL ELECTRON SOURCE AS WELL AS A LIQUID METAL-ION SOURCE OR LIQUID METAL ELECTRON SOURCE

(71) Applicant: Technische Universität Dresden, Dresden (DE)

(72) Inventor: Martin Tajmar, Dresden (DE)

(73) Assignee: TECHNISCHE UNIVERSITÄT DRESDEN, Dresden (DE)

(*) Notice: Subject to any disclaimer, the term of this patent is extended or adjusted under 35 U.S.C. 154(b) by 133 days.

(21) Appl. No.: 17/339,937

(22) Filed: Jun. 4, 2021

(65) Prior Publication Data
US 2021/0383994 A1    Dec. 9, 2021

(30) Foreign Application Priority Data

Jun. 5, 2020   (DE) .......................... 102020114999.9

(51) Int. Cl.
| | | |
|---|---|---|
| *H01J 1/02* | (2006.01) | |
| *H01J 7/44* | (2006.01) | |
| *B64G 1/40* | (2006.01) | |
| *H01J 27/02* | (2006.01) | |
| *H01J 27/22* | (2006.01) | |
| *H01J 27/26* | (2006.01) | |

(52) U.S. Cl.
CPC ................ *H01J 1/02* (2013.01); *B64G 1/405* (2013.01); *H01J 7/44* (2013.01); *H01J 27/02* (2013.01); *H01J 27/22* (2013.01); *H01J 27/26* (2013.01)

(58) Field of Classification Search
CPC .... H01J 1/02; H01J 27/02; H01J 27/22; H01J 27/26
See application file for complete search history.

(56) References Cited

U.S. PATENT DOCUMENTS

| | | |
|---|---|---|
| 2003/0230961 A1 | 12/2003 | Madocks |
| 2009/0121160 A1 | 5/2009 | Winkler et al. |
| 2010/0251690 A1 | 10/2010 | Kueneman et al. |

FOREIGN PATENT DOCUMENTS

DE          3688808 T2     1/1994

*Primary Examiner* — Joseph L Williams
(74) *Attorney, Agent, or Firm* — Cook Alex Ltd.

(57) ABSTRACT

The invention relates to a liquid metal-ion beam system (1) or liquid metal electron beam system, including:
 a conductive emitter electrode (2),
 a conductive extractor electrode (3) opposite to the emitter electrode (2),
 a liquid metal reservoir (4) which is fluidically connected to the emitter electrode (2) for transporting liquid metal to the emitter electrode (2),
 a control unit (5) which is configured to apply a periodically varying operating voltage between emitter electrode (2) and extractor electrode (3).

11 Claims, 2 Drawing Sheets

METHOD AND DEVICE FOR OPERATING A LIQUID METAL-ION SOURCE OR LIQUID METAL ELECTRON SOURCE AS WELL AS A LIQUID METAL-ION SOURCE OR LIQUID METAL ELECTRON SOURCE

TECHNICAL FIELD

The invention relates to liquid metal-ion sources, in particular for electric space propulsions and ion beam tools in focused ion beam systems, as well as liquid metal electron sources. Furthermore, the present invention relates to methods for operating such liquid metal-ion sources or liquid metal electron sources with reduced consumption of liquid metal.

TECHNICAL BACKGROUND

For many decades, liquid metal-ion sources are being used for electric space propulsions, as known for example from M. Tajmar et al., "Liquid metal-ion source development for space propulsion at ARC," Ultramicroscopy, Vol. 109, No. 5, pages 442-446, 2009, and as ion beam tools in focused ion beam facilities, as known from J. Gierak, "Focused ion beam technology and ultimate applications", Semiconductor Science and Technology, Vol. 24, No. 4, page 043001, 2009.

In general, liquid metal-ion sources or liquid metal electron sources of such devices have an emitter shaped like a pointed or porous needle or a capillary protruding from a reservoir containing liquid metal. An extractor, e.g. configured as a perforated electrode, is arranged by being spaced therefrom. A metal having a low melting point, such as gallium or indium, is often used as the propellant, which is supplied to the emitter.

A heater is used to heat up the emitter to a temperature at which the metallic propellant is liquid. When a high voltage is applied between the emitter and extractor, a liquid metal cone is formed on the emitter tip having an atomic tip which extends toward the extractor. At this point, the electric field is large enough that, depending on the polarity, ions are emitted when operating as a liquid metal-ion source or electrons are emitted when operating as liquid metal-ion sources.

When operating as a liquid metal-ion source, a positive voltage with respect to the extractor is supplied to the emitter. Up to a critical current threshold of a few µA, a pure ion beam is generated. As the current rises above this threshold, lightly charged micro-droplets are emitted, in addition to the ion stream, which micro-droplets extract from the liquid metal cone. The micro-droplets are formed because the transport of the liquid metal material to the tip of the emitter is not fast enough and therefore the atomic tip of the liquid metal cone collapses repeatedly.

The micro-droplets are only slightly electrically charged and therefore do not contribute significantly to generating a thrust force upon operation in a propulsion system. The efficiency of the liquid metal-ion source as a propulsion system decreases and fuel consumption increases significantly. The ion beam that is formed is therefore pulsating. The pulsation frequency depends on the geometry of the emitters and the viscosity of the liquid metal, and is usually in the high kHz and low MHz range starting from the critical current.

The use of liquid metal electron sources is advantageous in the case when high electron currents are to be generated. In a liquid metal electron source, a negative voltage is applied between the emitter and the extractor. A liquid metal cone is also formed here, and the atomic tip leads directly to the generation of an electron current. Continuous operation is not possible in this mode of operation, and the electrons are always emitted in a pulsed manner, since the electrons ionize neutral atoms in the vicinity, which are attracted to the negatively charged emitter tip by their positive charge. This bombardment leads to an intense local heating of the tip, which causes even more electrons to be emitted. An avalanche effect is created, leading to an explosively increasing electron current in the range of several Ampere before the entire liquid metal tip evaporates and the process starts again. The consumption of liquid metal is also relatively high in this mode of operation. In addition, the emission of metal droplets is a major disadvantage for many applications, since only electrons are required and the metal vapor covers the surrounding surfaces.

While liquid metal-ion sources for focused-ion-beam applications are usually operated at very low currents, which are below the critical current threshold, currents above the critical current threshold are used for space propulsion systems in order to achieve relevant thrust power. In this case, droplet generation and the associated additional loss of propellant mass are accepted. The droplet generation requires extensive protection measures (e.g. labyrinth shields) and limits the lifetime. The best solution to date is to use a very pointed needle emitter, which has an efficiency advantage over a capillary emitter, as is known from M. Tajmar, "Influence of Taylor cone size on droplet generation in an indium liquid metal-ion source," Appl. Phys. A Mater. Sci. Process, vol. 81, no. 7, pages 1447-1450, 2005.

Liquid metal electron sources are currently a niche product. The single current pulse is high and the repetition frequency is in the microsecond range, which makes the practical use of such electron sources difficult, since alternative solutions generate more uniform electron currents without the generation of metal droplets.

From EP 0 202 685 A1, a liquid metal-ion source is known having an ion emitter tip to which an ion source liquid metal material is supplied, having an extraction electrode for extracting an ion beam from the emitter tip, and having first means for applying a DC voltage between the emitter tip and the extraction electrode. The DC voltage is set to a value adjacent to the threshold voltage for extracting an ion beam. A second means is provided for superimposing voltage pulses on the DC voltage to cause the extraction of a pulsating ion beam.

It is therefore an object of the present invention to provide operation of a liquid metal-ion source or a liquid metal electron source in such a manner that the consumption of the liquid metal used is reduced.

DISCLOSURE OF THE INVENTION

This object is achieved by providing the method for operating a liquid metal-ion source or liquid metal electron source according to claim 1, as well as a liquid metal-ion beam system or liquid metal electron beam system according to the independent claim.

Further embodiments are defined in the dependent claims.

According to a first aspect, a liquid metal-ion beam system or a liquid metal electron beam system is provided, comprising:
  a conductive emitter electrode,
  a conductive extractor electrode opposite the emitter electrode, a liquid metal reservoir fluidically connected to the emitter electrode for transporting liquid metal to the emitter electrode, a control unit configured to apply a periodically varying operating voltage between the emitter electrode and the extractor electrode.

According to a further aspect, a method for operating a liquid metal-ion beam system or liquid metal electron beam system is provided, comprising:

a conductive emitter electrode, a conductive extractor electrode opposite the emitter electrode, a liquid metal reservoir fluidically connected to the emitter electrode for transporting liquid metal to the emitter electrode, wherein a periodically varying operating voltage is applied between the emitter electrode and the extractor electrode.

The liquid metal-ion source or liquid metal electron source provides an emitter electrode and an extractor electrode, whereby these are operated by applying a periodically varying operating voltage between the emitter electrode and the extractor electrode in such a way that ions or electrons are emitted from the emitter electrode. In this case, the emitter electrode is supplied with a liquid metal which, during operation, accumulates in a region of the emitter electrode facing the extractor electrode and is used there to generate ions or electrons.

Furthermore, an operating voltage threshold may be predetermined which defines a voltage amount above which not ionized or is only slightly ionized liquid metal is extracted at the emitter electrode by emitted ions or electrons accelerated in the direction of the extractor electrode, wherein the control unit is configured to vary the periodically varying operating voltage between a below-threshold voltage, which is below the operating voltage threshold in terms of amount, and an above-threshold voltage, which is above the operating voltage threshold in terms of amount.

Depending on the material of the liquid metal and the geometry of the emitter, there is an operating voltage threshold above which droplet generation occurs, i.e. droplets of liquid metal are extracted from the emitter due to the generation of liquid metal-ions, or liquid metal is vaporized at the emitters due to an avalanche effect, respectively.

The generation of droplets occurs only after a certain period of time after the operating voltage threshold is exceeded by the operating voltage. Therefore, pulsed operation with alternating voltages between the above-threshold voltage and the below-threshold voltage may prevent droplet generation despite exceeding the operating voltage threshold. The operating frequency of the voltage variation is thereby adjusted in such a way that a generation of droplets at the emitter electrode is avoided.

Here, on the one hand, the extractor may be applied to a reference potential and a pulse voltage of a pulse voltage source may be applied to the emitter. In this case there is an advantage that the configuration has low complexity, since only one high-voltage source (pulse voltage source) is required. However, high voltage pulses are required for the pulse voltage, which cannot always be generated easily. By additionally using needle emitters as emitters, the time to build up a liquid metal cone or droplet that forms around the needle tip of the emitter may be reduced.

In a further alternative embodiment, the extractor may be connected to a reference potential and the emitter may be connected to a constant operating potential, resulting in a voltage difference below the operating voltage threshold. As a result, a liquid metal cone is built up at the emitter, but no emission occurs. Pulsed operation of the ion or electron source may be achieved by applying, i.e. serially adding a pulsed potential source, which thereby only needs to provide a lower pulsed potential.

Alternatively, the extractor may be connected to a high constant operating potential, and the emitter may be connected to a reference potential so that a voltage difference below the operating voltage threshold is established. The pulse voltage source is applied between the reference potential and the emitter and provides a periodic voltage swing that varies the operating voltage between the emitter and the extractor between the first voltage difference and the second voltage difference. The pulse voltage source does not require high voltage isolation and also requires only a small voltage swing of the voltage pulses. The energy of the ion beam or electron beam produced in this way is relatively low for operation as an electron source, but is advantageous since only negative charges are required for the charge balance.

By selecting a suitable pulse frequency of the pulse voltage source that prevents droplets from forming, the consumption of liquid metal to operate the liquid metal-ion or liquid metal electron source may be significantly reduced. The pulse frequency may be fixed, in particular in a frequency range between 100 kHz and 100 MHz for a liquid metal-ion source and between 1 MHz to 1 GHz for a liquid metal electron source. Alternatively, the pulse frequency may also adjust by regulated operation, in particular by reducing the applied potential difference below an operating voltage when the ion or electron current exceeds a predetermined threshold or when a gradient of the ion or electron current exceeds a predetermined gradient threshold.

According to one embodiment, the operating voltage may be generated by a constant high voltage source for providing a constant high voltage and a pulse voltage source for providing a periodically varying pulse voltage which are connected in series with the emitter electrode and the extractor electrode arrangement, wherein the sum of the voltages of the constant high voltage source and the pulse voltage source provide the periodically varying operating voltage.

It may be provided that the pulse voltage source is connected to a reference potential, in particular a ground potential.

Furthermore, the emitter electrode may be configured to be a tip electrode or a capillary electrode.

The control unit may be configured to adjust the periodically varying operating voltage by a regulated operation, wherein the operating voltage is reduced in terms of amount below the operating voltage threshold when the current flow through the arrangement of emitter electrode and extractor electrode exceeds in terms of amount a current intensity above a predetermined current threshold and/or a current gradient increases in terms of amount above a predetermined gradient threshold, and wherein the operating voltage is raised above the operating voltage threshold when the current flow through the arrangement of emitter electrode and extractor electrode falls below a current intensity above a predetermined current threshold in terms of amount and/or a current gradient falls below a predetermined gradient threshold in terms of amount. In this case, the predetermined current threshold and the predetermined gradient threshold are selected to indicate the threshold of onset of droplet generation.

According to one embodiment, the liquid metal-ion beam system may be operated at a pulse frequency of the operating voltage of more than 100 kHz and less than 100 MHz.

Further, in the liquid metal electron beam system, the pulse frequency of the operating voltage may be more than 1 MHz and less than 1 GHz.

According to a further aspect, a system is provided comprising the above liquid metal-ion beam system and the above liquid metal electron beam system, wherein the operating voltages are referenced to a same reference potential. In this way, electrostatic charging of a non-grounded vehicle, in particular a spacecraft may be avoided since a charge balance may be achieved between the amount of positive and negative charge emitted.

In particular, the liquid metal-ion beam system and the liquid metal electron beam system may be operated at identical pulse frequencies, in particular out of phase, in order to reduce alternating loading of an electrical energy storage device.

In addition, when used as a propulsion system for a spacecraft, a single liquid metal-ion beam system that may serve as both an ion source and an electron source would allow a charge balance to be established by alternating operation as an ion source and an electron source so that charging of the spacecraft may be avoided or a separate electron source would not be necessary.

BRIEF DESCRIPTION OF THE DRAWINGS

Embodiments are explained in more detail below with reference to the accompanying drawings, wherein.

DESCRIPTION OF EMBODIMENTS

Figure 1:
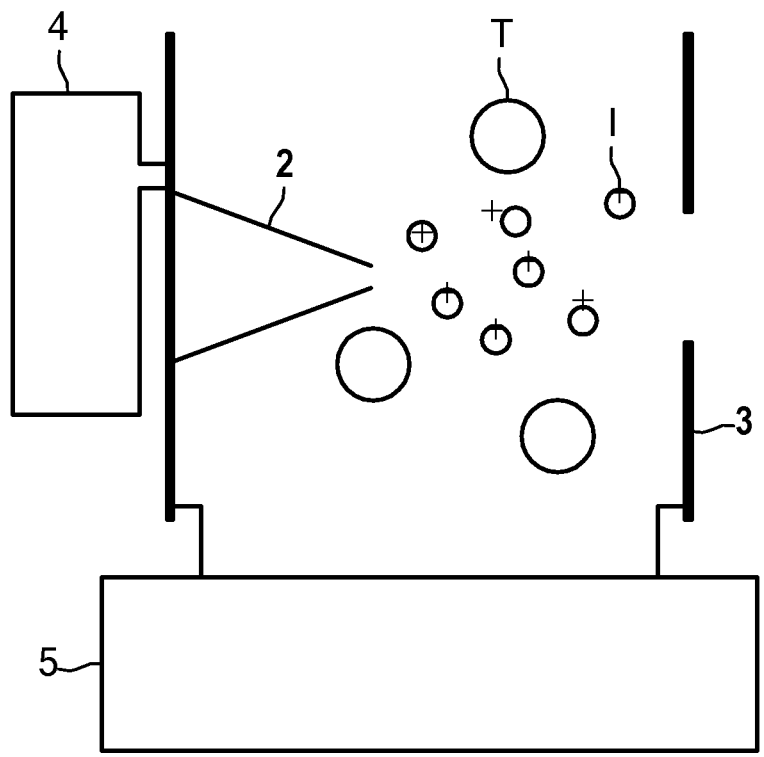
FIG. 1 shows a schematic representation of a liquid metal-ion beam system.

FIG. 1 shows a schematic representation of a liquid metal-ion beam system 1 having a conductive emitter electrode 2, which may be in the form of a conductive tip electrode (as shown) or which alternatively may be in the form of a capillary electrode, and a conductive extractor electrode 3 opposite the emitter electrode 2 for accelerating charge carriers. The extractor 3 may be configured to be a pinhole.

A liquid metal reservoir 4 is arranged near the emitter electrode 2, which reservoir is fluidically connected to the area of the emitter electrode 2 for transporting liquid metal to the emitter electrode 2. A very pointed liquid metal cone is formed at the tip of the emitter electrode 2 from which, upon operation, the metal-ions are extracted and accelerated toward the extractor electrode 3. The material of metal-ions thus extracted is replaced from the liquid metal reservoir 4.

A control unit 5 is provided which applies a positive operating voltage $V_E$ between emitter electrode 2 and extractor electrode 3. The operating voltage $V_E$ is of an amount which causes ions I to be extracted at the emitter electrode 2 and accelerated in the direction of the extractor electrode 3. This causes a current to flow in the µA range.

If the current rises above a threshold current, in addition to the ion current, lightly charged microdroplets T may be extracted and discharged from the tip of the emitter electrode 2, thus significantly increasing the consumption of liquid metal without these droplets T contributing significantly to the ion beam.

The configuration of FIG. 1 may also be operated as a liquid metal electron beam system if the control unit 5 applies a negative operating voltage $V_E$ between emitter electrode 2 and extractor electrode 3. The amount of the operating voltage $V_E$ is such that electrons are emitted at the emitter electrode 2.

When operating as an electron source, a liquid metal cone is formed at the tip of the electrode, which leads directly to the generation of the electron current. The electrons are always emitted in a pulsed manner, since the electrons ionize neutral atoms in the vicinity, which are attracted with their positive charge by the negatively charged tip of the emitter electrode. This bombardment leads to a intense local heating of the tip and to an intensifying emission of electrons as a result. This avalanche effect leads to a very high electron current, which causes the liquid metal cone at the tip of the emitter electrode 2 to evaporate. This process leads to a consumption of liquid metal and to an intense abrasion of the emitter electrode 2.

In order to avoid these effects, it is hence envisaged to operate the liquid metal-ion beam system or the liquid metal electron beam system with a pulsed operating voltage $V_E$. In this case, the operating voltage $V_E$ applied between the emitter electrode 2 and the extractor electrode 3 is varied periodically between a below-threshold voltage, which is below an operating voltage threshold $V_{thr}$ in terms of amount, and an above-threshold voltage, which is above an operating voltage threshold $V_{thr}$ in terms of amount. The operating voltage threshold corresponds to a voltage threshold above which droplet generation or liquid metal extraction occurs.

The pulse frequency of the operating voltage $V_E$ is selected such that the above-mentioned effects are avoided, i.e. droplet generation when operating as an ion source and evaporation when operating as an electron source. The pulse frequency may be fixed, and may in particular be more than 100 kHz and less than 100 MHz for liquid metal-ion sources, and may be more than 1 MHz and less than 1 GHz for liquid metal electron sources.

The pulse shape may be rectangular, sinusoidal, sawtooth or may have another shape.

In principle, several variants are conceivable for generating the periodically varying operating voltage $V_E$.

Figure 2A:
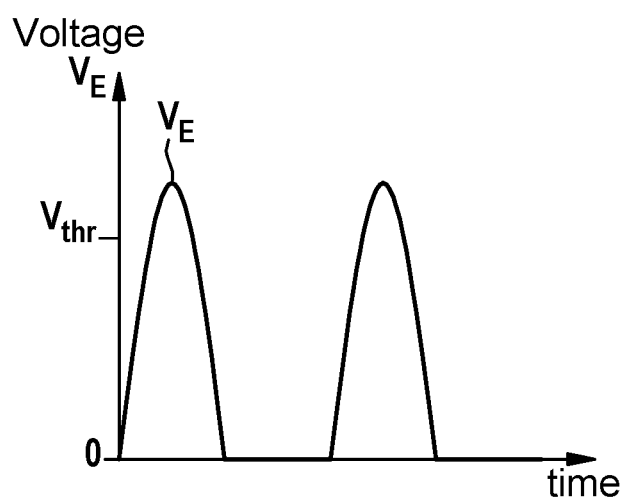
FIGS. 2a to 2c show different variants of the generation of the pulsed operating voltage for the liquid metal-ion source or liquid metal electron source.
Figure 2A:
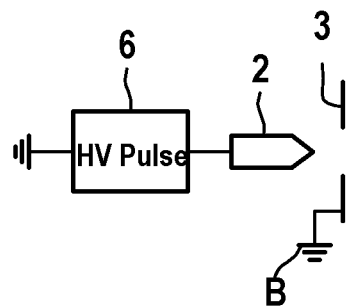

As shown in FIG. 2a, the extractor electrode 3 may be connected to a reference or ground potential B. The emitter electrode 2 is connected to an operating voltage source 6, which is periodically varied and which directly generates the operating voltage $V_E$. Voltage pulses are illustrated in the voltage-time diagram shown. The complexity of such an arrangement is relatively low, since only the operating voltage source 6 is necessary. However, this operating voltage source has to provide high voltage pulses with very high voltages, which voltages may only be generated in a very complex fashion. The below-threshold voltage may have a potential corresponding to the reference potential B or corresponding to a potential between the reference potential B and the operating voltage threshold $V_{thr}$. Also, the emitter electrode 2 should be configured to be a tip electrode, since the time to build up a liquid metal cone depends on the geometry of the electrode and, in the case of emitter electrodes configured to be capillaries, usually requires more time than is provided by the pulse width of the operating voltage $V_E$ (duration of the application of the above-threshold voltage).

Figure 2B:
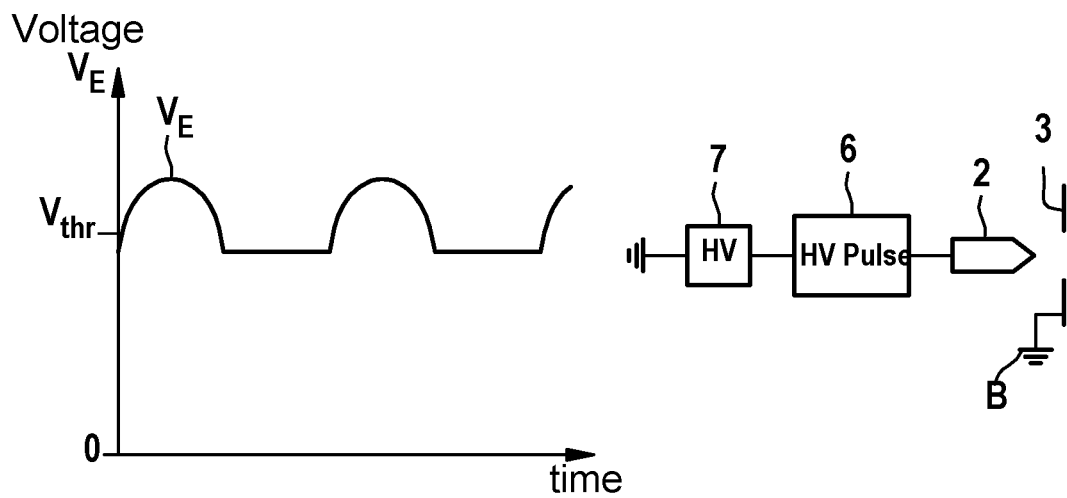

The embodiment of FIG. 2b shows a connection of the extractor electrode 3 with the reference potential (ground potential) B, wherein a constant high voltage HV is applied to the emitter electrode 2 by use of a constant high voltage source 7, the level of which is below the operating voltage threshold, below which no ion or electron current is emitted.

In addition, a pulsed voltage source 8 is connected in series, which uses a pulsed voltage to raise or lower the operating voltage $V_E$ applied to the emitter electrode 2 above the operating voltage threshold $V_{thr}$. Thus, the high voltage source 7 and the pulsed voltage source 8 form the operating voltage source of FIG. 2a. By applying the below-threshold voltage in the range of the operating voltage threshold $V_{thr}$, in particular in a range between 70% and 90% of the operating voltage threshold, the build-up of a liquid metal cone is enabled, but no emission of ions or electrons is caused. By adding the pulse voltage source 8 in a pulsed manner, which pulse voltage source only has to provide a lower voltage, the liquid metal-ion source or liquid metal electron source may now be operated with reduced liquid metal consumption.

Figure 2C:
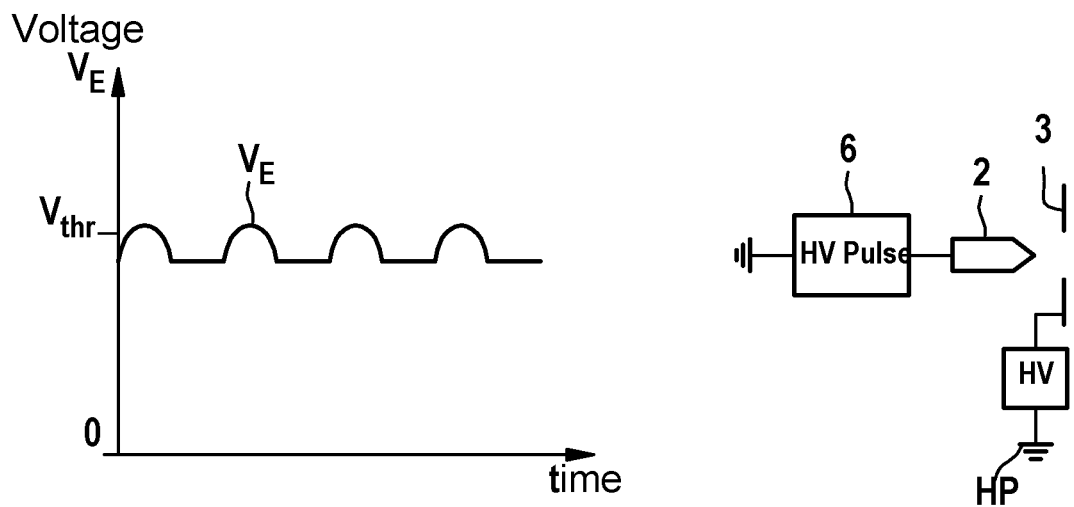

In the embodiment shown in FIG. 2c, the extractor electrode 3 may be operated at a high constant potential HP below the operating voltage threshold $V_{thr}$ in the reverse polarity with respect to the emitter electrode 2. By use of a pulse voltage source 8, a periodic pulse voltage is generated and applied to the emitter electrode 2. In contrast to the previous embodiment, this requires no high-voltage isolation, and it also requires only a relatively small voltage swing to raise the total potential between emitter electrode 2 and extractor electrode 3 above the operating voltage threshold $V_{thr}$.

The operating voltage source 6 or the pulse voltage source 8 are configured to raise the total voltage between the emitter electrode 2 and the extractor electrode 3 from the below-threshold voltage above the operating voltage threshold $V_{thr}$ in a pulsed operation to an above-threshold voltage and to lower it below. The adjusting frequency may be fixed or adjusted by a regulated operation. At the fixed frequency, a frequency between 100 kHz and 100 MHz should be selected for a liquid metal-ion source, and a frequency in the range between 1 MHz and 1 GHz should be selected for a liquid metal electron source.

Upon regulated operation, the lowering below the operating voltage threshold $V_{thr}$ may be performed when the ion or electron current exceeds in terms of amount a current above a predetermined current threshold or when the current gradient rises above a predetermined gradient threshold. After lowering the operating voltage $V_E$ to the below-threshold voltage, the above-threshold voltage may be reapplied or the operating voltage $V_E$ may be increased again after a dead time to restart the cycle.

LIST OF REFERENCE SIGNS

1 Liquid metal-ion beam system
2 Emitter electrode
3 Extractor electrode
4 Liquid metal reservoir
5 Control unit
6 Operating voltage source
7 Constant high voltage source
8 Pulse voltage source
B Reference potential
HP High voltage potential
$V_{thr}$ Operating voltage threshold
$V_E$ Operating voltage

The invention claimed is:

1. A liquid metal-ion beam system or liquid metal electron beam system comprising:
   a conductive emitter electrode,
   a conductive extractor electrode opposite to the emitter electrode,
   a liquid metal reservoir which is fluidically connected to the emitter electrode for transporting liquid metal to the emitter electrode, and
   a control unit which is configured to apply a periodically varying operating voltage between the emitter electrode and the extractor electrode.

2. The liquid metal-ion beam system or liquid metal electron beam system according to claim 1, wherein an operating voltage threshold is predetermined which defines a voltage amount above which liquid metal, which is not ionized or is only slightly ionized at the emitter electrode, is extracted by emitted ions or electrons accelerated in the direction of the extractor electrode, wherein the control unit is configured to vary the periodically varying operating voltage between a below-threshold voltage, which is below the operating voltage threshold in terms of amount, and an above-threshold voltage, which is above the operating voltage threshold in terms of amount.

3. The liquid metal-ion beam system or liquid metal electron beam system according to claim 1, wherein the operating voltage is generated by a constant high voltage source for providing a constant high voltage and a pulse voltage source for providing a periodically varying pulse voltage, connected in series with the arrangement of the emitter electrode and the extractor electrode, wherein the sum of the voltages of the constant high voltage source and the pulse voltage source yields the periodically varying operating voltage.

4. The liquid metal-ion beam system or liquid metal electron beam system according to claim 3, wherein the pulse voltage source is connected to a reference potential, in particular a ground potential.

5. The liquid metal-ion beam system or liquid metal electron beam system according to claim 1, wherein the emitter electrode is configured to be a tip electrode or a capillary electrode.

6. The liquid metal-ion beam system or liquid metal electron beam system according to claim 1, wherein the control unit is configured to adjust the periodically varying operating voltage by a regulated operation, wherein the operating voltage is reduced in terms of amount below the operating voltage threshold, when the current flow through the arrangement of emitter electrode and extractor electrode exceeds in terms of amount a current intensity above a predetermined current threshold and/or when a current gradient rises in terms of amount above a predetermined gradient threshold, and wherein the operating voltage is raised above the operating voltage threshold, when the current flow through the arrangement of emitter electrode and extractor electrode falls below a current intensity above a predetermined current threshold in terms of amount and/or a current gradient falls below a predetermined gradient threshold in terms of amount.

7. The liquid metal-ion beam system according to claim 1, wherein the pulse frequency of the operating voltage is more than 100 kHz and less than 100 MHz.

8. The liquid metal electron beam system according to claim 1, wherein the pulse frequency of the operating voltage is more than 1 MHz and less than 1 GHz.

9. A method for operating a liquid metal-ion beam system or liquid metal electron beam system, comprising:
   a conductive emitter electrode,
   a conductive extractor electrode opposite to the emitter electrode,
   a liquid metal reservoir which is fluidically connected to the emitter electrode for transporting liquid metal to the emitter electrode, wherein a periodically varying operating voltage is applied between the emitter electrode and the extractor electrode.

10. A system comprising a liquid metal-ion beam system and a liquid metal electron beam system, the system comprising:
- a conductive emitter electrode,
- a conductive extractor electrode opposite to the emitter electrode,
- a liquid metal reservoir which is fluidically connected to the emitter electrode for transporting liquid metal to the emitter electrode, and
- a control unit which is configured to apply a periodically varying operating voltage between the emitter electrode and the extractor electrode,
- wherein the control unit applies a positive operating voltage between the emitter electrode and the extractor electrode to emit ions from the emitter electrode,
- wherein the control unit applies a negative operating voltage between the emitter electrode and the extractor electrode to emit electrons from the emitter electrode, and
- wherein the operating voltages relate to a same reference potential.

11. The system according to claim 10, wherein the liquid metal-ion beam system and the liquid metal electron beam system are operated with identical pulse frequencies, in particular phase-shifted, in order to reduce an alternating load of an electrical energy storage device.

\* \* \* \* \*